United States Patent
Park et al.

(10) Patent No.: US 9,324,939 B2
(45) Date of Patent: Apr. 26, 2016

(54) SYNTHETIC ANTIFERROMAGNET (SAF) COUPLED FREE LAYER FOR PERPENDICULAR MAGNETIC TUNNEL JUNCTION (P-MTJ)

(71) Applicant: QUALCOMM Incorporated, San Diego, CA (US)

(72) Inventors: Chando Park, San Diego, CA (US); Matthias Georg Gottwald, Heverlee (BE); Kangho Lee, San Diego, CA (US); Seung Hyuk Kang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/321,516

(22) Filed: Jul. 1, 2014

(65) Prior Publication Data

US 2016/0005955 A1 Jan. 7, 2016

(51) Int. Cl.
*H01L 29/82* (2006.01)
*H01L 43/10* (2006.01)
*H01L 43/12* (2006.01)
*H01L 43/08* (2006.01)

(52) U.S. Cl.
CPC ............... *H01L 43/10* (2013.01); *H01L 43/08* (2013.01); *H01L 43/12* (2013.01)

(58) Field of Classification Search
CPC ....... H01L 27/222; H01L 43/10; H01L 43/12; H01L 43/08
USPC ........................................................ 257/421
See application file for complete search history.

(56) References Cited

U.S. PATENT DOCUMENTS

| 6,714,446 | B1 | 3/2004 | Engel |
| 7,531,882 | B2 | 5/2009 | Nguyen et al. |
| 2004/0120184 | A1 | 6/2004 | Janesky et al. |
| 2008/0239589 | A1 | 10/2008 | Guo et al. |
| 2013/0187248 | A1 | 7/2013 | Kariyada et al. |
| 2013/0188421 | A1 | 7/2013 | Dieny |
| 2013/0221459 | A1 | 8/2013 | Jan et al. |
| 2013/0221460 | A1* | 8/2013 | Jan et al. ................. H01L 43/10 257/421 |
| 2014/0306302 | A1 | 10/2014 | Jan et al. |

FOREIGN PATENT DOCUMENTS

WO 2013182701 A1 12/2013

OTHER PUBLICATIONS

International Search Report and Written Opinion—PCT/US2015/029264—ISA/EPO—Jul. 21, 2015.
Yoshida, C., et al., "Enhanced Thermal Stability in Perpendicular Top-Pinned Magnetic Tunnel Junction With Synthetic Antiferromagnetic Free Layers," IEEE Transactions on Magnetics, vol. 49, No. 7, Jul. 2013, pp. 4363-4366.

* cited by examiner

*Primary Examiner* — Douglas Menz
(74) *Attorney, Agent, or Firm* — Muncy, Geissler, Olds & Lowe, P.C.

(57) ABSTRACT

A magnetic tunnel junction (MTJ) device in a magnetoresistive random access memory (MRAM) and method of making the same are provided to achieve a high tunneling magnetoresistance (TMR), a high perpendicular magnetic anisotropy (PMA), good data retention, and a high level of thermal stability. The MTJ device includes a first free ferromagnetic layer, a synthetic antiferromagnetic (SAF) coupling layer, and a second free ferromagnetic layer, where the first and second free ferromagnetic layers have opposite magnetic moments.

24 Claims, 5 Drawing Sheets

SYNTHETIC ANTIFERROMAGNET (SAF) COUPLED FREE LAYER FOR PERPENDICULAR MAGNETIC TUNNEL JUNCTION (P-MTJ)

FIELD OF DISCLOSURE

Various embodiments described herein relate to magnetoresistive random access memory (MRAM), and more particularly, to magnetic tunnel junction (MTJ) in MRAM.

BACKGROUND

MRAM (Magnetoresistive Random Access Memory) is a non-volatile memory that may utilize MTJ (Magnetic Tunnel Junction) devices, where the state of an MTJ device depends on the magnetic (electron-spin) orientation of its ferromagnetic layers. A STT-MTJ (Spin Torque Transfer MTJ) changes the spin orientation by using a switching current. To achieve high-density MRAM with good thermal stability and low switching current, attempts have been made to develop MTJ devices with a high perpendicular magnetic anisotropy (PMA). In a perpendicular magnetic tunnel junction (p-MTJ) having a free ferromagnetic layer, the orientation of the magnetic field in the free ferromagnetic layer is perpendicular to the interface between the barrier and ferromagnetic layers. It is desirable for a p-MTJ device to have a high tunneling magnetoresistance (TMR), a high PMA, and good data retention.

SUMMARY

Exemplary embodiments of the invention are directed to a magnetic tunnel junction (MTJ) device and method for making the same, with improved tunneling magnetoresistance (TMR), perpendicular magnetic anisotropy (PMA), data retention, and thermal stability. Moreover, the magnetic and electrical properties of the MTJ device according to embodiments of the invention can be maintained at high process temperatures.

In an embodiment, a magnetoresistive random access memory (MRAM) device comprises: a first free ferromagnetic layer having a first magnetic moment; a synthetic antiferromagnetic (SAF) coupling layer disposed on the first free ferromagnetic layer; and a second free ferromagnetic layer disposed on the SAF coupling layer, the second free ferromagnetic layer having a second magnetic moment opposite to the first magnetic moment of the first free ferromagnetic layer.

In another embodiment, a magnetic tunnel junction (MTJ) device comprises: a first free ferromagnetic layer having a first magnetic moment; a synthetic antiferromagnetic (SAF) coupling layer disposed on the first free ferromagnetic layer; and a second free ferromagnetic layer disposed on the SAF coupling layer, the second free ferromagnetic layer having a second magnetic moment opposite to the first magnetic moment of the first free ferromagnetic layer.

In another embodiment, a method for making a magnetic tunnel junction (MTJ) comprises the steps for: forming a first free ferromagnetic layer having a first magnetic moment; forming a synthetic antiferromagnetic (SAF) coupling layer on the first free ferromagnetic layer; and forming a second free ferromagnetic layer on the SAF coupling layer, the second free ferromagnetic layer having a second magnetic moment opposite to the first magnetic moment of the first free ferromagnetic layer.

In yet another embodiment, a method of making a magnetic tunnel junction (MTJ) comprises the steps of: forming a first free ferromagnetic layer having a first magnetic moment; forming a synthetic antiferromagnetic (SAF) coupling layer on the first free ferromagnetic layer, the SAF coupling layer comprising a material selected from the group consisting of ruthenium (Ru) and chromium (Cr); and forming a second free ferromagnetic layer on the SAF coupling layer, the second free ferromagnetic layer having a second magnetic moment opposite to the first magnetic moment of the first free ferromagnetic layer.

BRIEF DESCRIPTION OF THE DRAWINGS

The accompanying drawings are presented to aid in the description of embodiments of the invention and are provided solely for illustration of the embodiments and not limitations thereof.

DETAILED DESCRIPTION

Aspects of the invention are disclosed in the following description and related drawings directed to specific embodiments of the invention. Alternate embodiments may be devised without departing from the scope of the invention. Additionally, well known elements of the invention will not be described in detail or will be omitted so as not to obscure the relevant details of the invention.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

The terminology used herein is for the purpose of describing particular embodiments only and is not intended to be limiting of embodiments of the invention. As used herein, the singular forms "a," "an," and "the," are intended to include the plural forms as well, unless the context clearly indicates otherwise. It will be further understood that the terms "comprises," "comprising," "includes," or "including," when used herein, specify the presence of stated features, integers, steps, operations, elements, or components, but do not preclude the presence or addition of one or more other features, integers, steps, operations, elements, components, or groups thereof. Moreover, it is understood that the word "or" has the same meaning as the Boolean operator "OR," that is, it encompasses the possibilities of "either" and "both" and is not limited to "exclusive or" ("XOR"), unless expressly stated otherwise.

Figure 1:
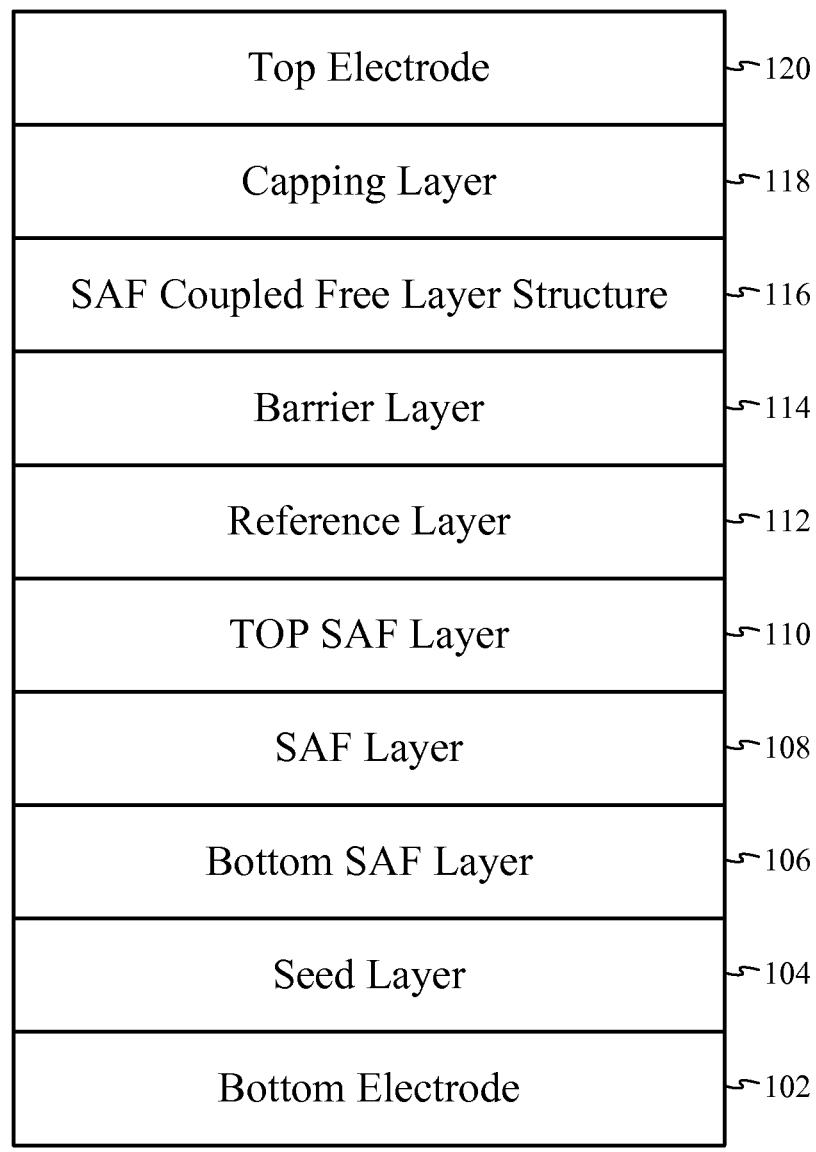
FIG. 1 is a sectional view of a magnetic tunnel junction (MTJ) in a magnetoresistive random access memory (MRAM) according to embodiments of the present invention.

FIG. 1 is a sectional view of a magnetic tunnel junction (MTJ) device 100 in a magnetoresistive random access memory (MRAM) which includes a synthetic antiferromagnetic (SAF) coupled free ferromagnetic layer structure according to embodiments of the present invention. In FIG. 1, a bottom electrode 102 is provided, and a seed layer 104 is disposed on the bottom electrode 102 in a conventional manner. In an embodiment, a bottom SAF layer 106 is formed on the seed layer 104, and an SAF layer 108, which may comprise ruthenium (Ru) or chromium (Cr), is formed on the bottom SAF layer 106. In a further embodiment, a top SAF layer 110 is formed on the SAF layer 108. In yet a further embodiment, a reference layer 112 is formed on the top SAF layer 110.

In an embodiment according to the present invention, a barrier layer 114 is formed on the reference layer 112. In a further embodiment, the barrier layer 114 comprises magnesium oxide (MgO). In yet a further embodiment, the barrier layer 114 comprises an MgO layer having a surface orientation of (100), which will be discussed in further detail below with respect to FIG. 2. Other materials may be implemented in the barrier layer 114 without departing from the scope of the present invention.

Figure 2:
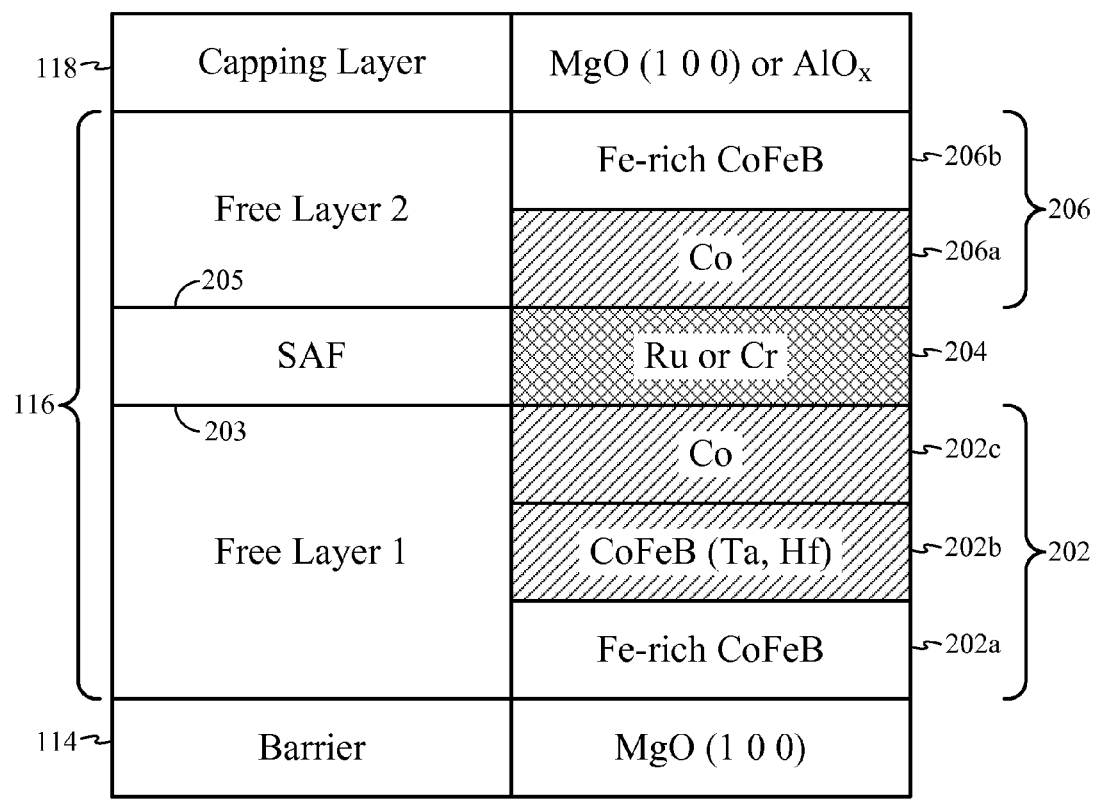
FIG. 2 is a more detailed sectional view of the barrier layer, the synthetic antiferromagnetic (SAF) coupled free ferromagnetic layer structure and the capping layer according to embodiments of the present invention.

Moreover, the MTJ device 100 comprises an SAF coupled free ferromagnetic layer structure 116, an embodiment of which includes a multi-layer structure as shown in FIG. 2, which will be discussed in further detail below. Referring to FIG. 1, the SAF coupled free ferromagnetic layer structure 116 is disposed on the barrier layer 114. In an embodiment, a capping layer 118 is formed on the SAF coupled free ferromagnetic layer structure 116. In a further embodiment, the capping layer 118 comprises an MgO layer having a surface orientation of (100). Alternatively, the capping layer 118 may comprise aluminum oxide ($AlO_x$). Other materials may be also be implemented in the capping layer 118 without departing from the scope of the present invention. In an embodiment, a top electrode 120 is formed on the capping layer 118.

FIG. 2 is a more detailed sectional view of the barrier layer 114, the SAF coupled free ferromagnetic layer structure 116 and the capping layer 118 according to embodiments of the present invention. In the embodiment shown in FIG. 2, the barrier layer 114 comprises an MgO layer having a surface orientation of (100). In an embodiment, the SAF coupled free ferromagnetic layer structure 116 comprises a first free ferromagnetic layer 202, which itself comprises a three-layer structure, an SAF coupling layer 204 formed on the first free ferromagnetic layer 202, and a second free ferromagnetic layer 206, which itself comprises a two-layer structure, on the SAF coupling layer 204. In an embodiment, the capping layer 118, which may comprise an MgO layer, or alternatively, an $AlO_x$ layer, is formed on the second free ferromagnetic layer 206.

In an embodiment, the first free ferromagnetic layer 202 comprises an iron-rich cobalt-iron-boron (Fe-rich CoFeB) layer 202a formed on the barrier layer 114. In a further embodiment, the Fe-rich CoFeB layer 202a has an epitaxial relationship with the barrier layer 114 to provide high tunneling magnetoresistance (TMR) and high perpendicular magnetic anisotropy (PMA). In a further embodiment, the Fe-rich CoFeB layer 202a is subjected to a high-temperature annealing process to transform the Fe-rich CoFeB material from an amorphous structure to a crystalline structure.

In an embodiment, an intermediate layer 202b is formed on the Fe-rich CoFeB layer 202a. In a further embodiment, the intermediate layer 202b comprises a cobalt-iron-boron-tantalum (CoFeBTa) layer. In another embodiment, the intermediate layer 202b comprises a cobalt-iron-boron-hafnium (CoFeBHf) layer. Alternatively, another element may be used as an alternative to tantalum (Ta) or hafnium (Hf) in a cobalt-iron-boron (CoFeB) structure in the intermediate layer 202b. In an embodiment, a thin layer of cobalt (Co) 202c is formed on the intermediate layer 202b. In a further embodiment, the Co layer 202c is not more than 5 Angstroms in thickness.

In an embodiment, the SAF coupling layer 204, which is formed above the thin Co layer 202c, comprises ruthenium (Ru). Alternatively, the SAF coupling layer 204 comprises chromium (Cr). Another element may be implemented in the SAF coupling layer 204 instead of Ru or Cr above the thin Co layer 202c within the scope of the present invention. The thin Co layer 202c helps increase SAF coupling to improve the PMA and prevent diffusion of the SAF coupling layer 204 during post annealing. As shown in FIG. 2, the Fe-rich CoFeB layer 202a, the intermediate layer 202b, which may comprise either CoFeBTa or CoFeBHf, and the thin Co layer 202c together form the first free ferromagnetic layer 202.

In an embodiment, the second free ferromagnetic layer 206 is formed on the SAF coupling layer 204, which may comprise Ru, Cr or another material. The second free ferromagnetic layer 206, which is positioned above the SAF coupling layer 204 opposite the first free ferromagnetic layer 202, enhances the PMA of the MTJ device. In an embodiment, the second free ferromagnetic layer 206 comprises a thin Co layer 206a formed above the SAF coupling layer 204. In a further embodiment, the thin Co layer 206a has a thickness of not more than 5 Angstroms. In an embodiment, a thin Fe-rich CoFeB layer 206b is formed on the thin Co layer 206a. The thin Co layer 206a and the thin Fe-rich CoFeB layer 206b together form the second free ferromagnetic layer 206. The thin Co layer 206a increases SAF coupling, improves PMA, and helps prevent Ru or Cr diffusion from the SAF coupling layer 204 during post annealing. Moreover, the thin Fe-rich CoFeB layer 206b further enhances the PMA of the MTJ device.

In an embodiment, the capping layer 118 is formed on the Fe-rich CoFeB layer 206b of the second free ferromagnetic layer 206. In an embodiment, the capping layer 118 may be regarded as an integral part of the second free ferromagnetic layer 206. As discussed above, the capping layer 118 may comprise MgO having a surface orientation of (100), or alternatively, $AlO_x$. In an embodiment, both the barrier layer 114 below the first free ferromagnetic layer 202 and the capping layer 118 above the second free ferromagnetic layer 206 comprise MgO having a surface orientation of (100), which is a surface orientation in reference to a planar interfacing surface 203 between the first free ferromagnetic layer 202 and the SAF coupling layer 204, or a planar interfacing surface 205 between the SAF coupling layer 204 and the second free ferromagnetic layer 206.

Figure 3A:
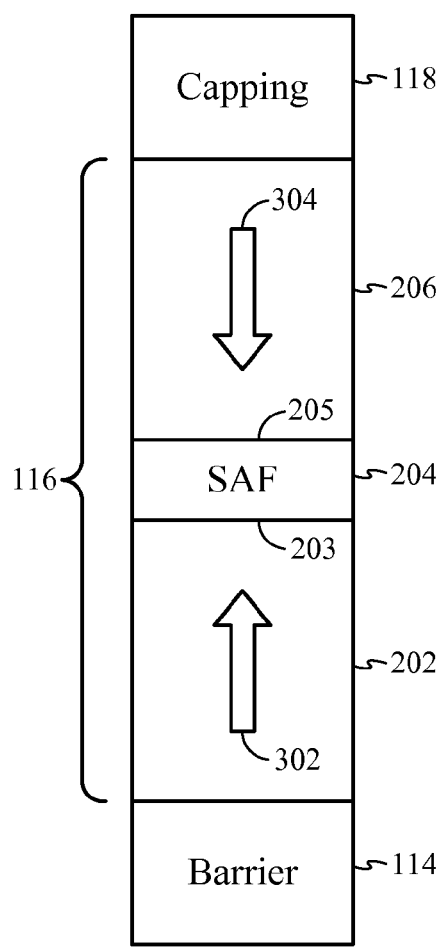
FIGS. 3A and 3B are diagrams illustrating opposite magnetic moments of the first and second free ferromagnetic layers of FIG. 2.
Figure 3B:
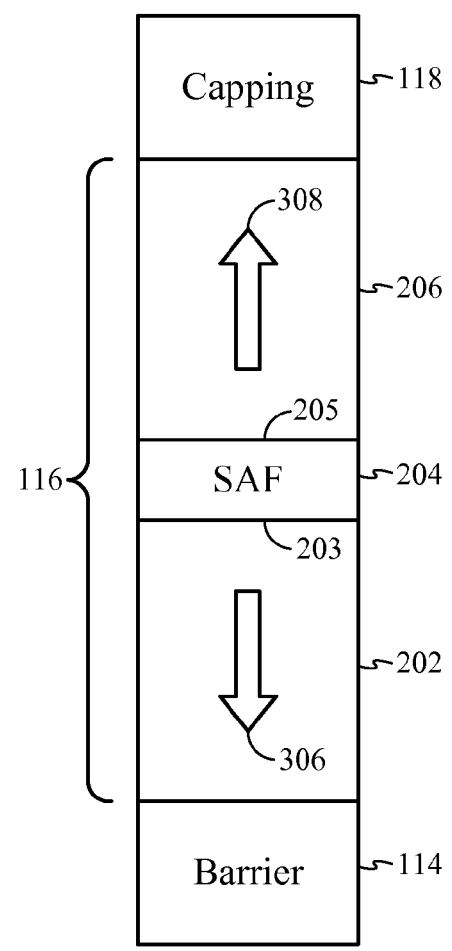

FIGS. 3A and 3B provide exemplary illustrations of opposite magnetic moments of the first and second free ferromagnetic layers of FIG. 2. FIG. 3A illustrates the SAF coupled free ferromagnetic layer structure 116 as part of an MTJ device, acting as a memory cell in an MRAM, with the first free ferromagnetic layer 202 having a magnetic moment in a direction indicated by an upward-pointing arrow 302, whereas the second free ferromagnetic layer 206 having a magnetic moment in a direction indicated by a downward-pointing arrow 304. The upward-pointing arrow 302 and the downward-pointing arrow 304 are perpendicular to the planar interfacing surfaces 203 and 205, and thus the MTJ device illustrated in FIGS. 1 and 2 and described above is called a perpendicular magnetic tunnel junction (p-MTJ) device. In FIG. 3B, the first free ferromagnetic layer 202 has a magnetic moment in a direction indicated by a downward-pointing arrow 306, whereas the second free ferromagnetic layer 206 has a magnetic moment in a direction indicated by an upward-pointing arrow 308.

In either FIG. 3A or FIG. 3B, the magnetic moment of the first free ferromagnetic layer 202 is opposite to the magnetic moment of the second free ferromagnetic layer 206. The SAF coupling layer 204 couples the magnetic orientations of the first and second free ferromagnetic layers 202 and 206 such that their magnetic or electron-spin orientations are opposite to each other, thereby resulting in reduced magnetic offset and reduced interference from stray magnetic fields. In an embodiment, the state of the MRAM memory cell of FIG. 3A, in which the directions 302 and 304 of magnetic moments of the first and second free ferromagnetic layers 202 and 206 point toward each other, may be regarded as storing a number "0," whereas the state of the MRAM memory cell of FIG. 3B, in which the directions 306 and 308 of magnetic moments of the first and second free ferromagnetic layers 202 and 206 point away from each other, may be regarded as storing a number "1." Alternatively, the state of the MRAM memory cell of FIG. 3A may be regarded as storing "1" whereas the state of the MRAM memory cell of FIG. 3B may be regarded as storing "0."

Figure 4:
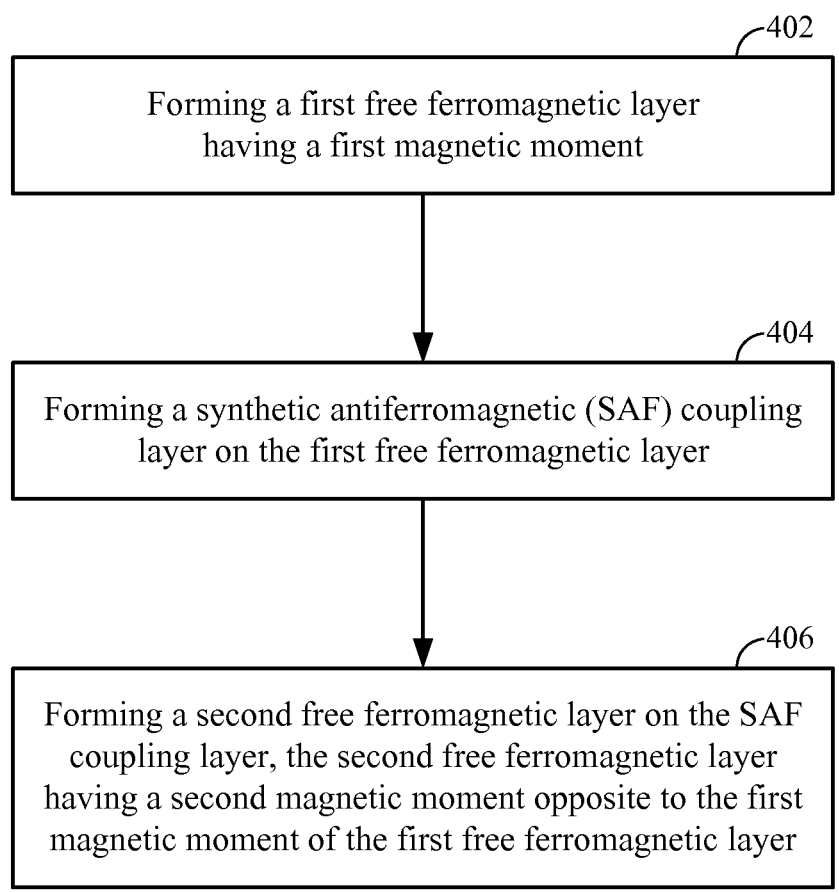
FIG. 4 is a flowchart illustrating a method of making an MTJ device according to embodiments of the present invention.

FIG. 4 is a flowchart illustrating a method of making an MTJ device according to embodiments of the present invention. In FIG. 4, a first free ferromagnetic layer having a first magnetic moment is formed in step 402. In an embodiment, the first free ferromagnetic layer 202 is formed on a barrier layer 114, for example, an MgO layer having a surface orientation of (100), as described above with reference to FIG. 2. In an embodiment, the first free ferromagnetic layer 202 comprises an Fe-rich CoFeB layer 202a, an intermediate layer 202b, which may comprise CoFeBTa or CoFeBHf, and a Co layer 202c as described above with reference to FIG. 2.

Referring to FIG. 4, a synthetic antiferromagnetic (SAF) coupling layer is formed on the first free ferromagnetic layer in step 404. In an embodiment, the SAF coupling layer comprises Ru, or alternatively, Cr, as described above with reference to FIG. 2. Referring back to FIG. 4, a second free ferromagnetic layer is formed on the SAF coupling layer, the second free ferromagnetic layer having a second magnetic moment opposite to the first magnetic moment of the first free ferromagnetic layer, in step 406. In an embodiment, the second free ferromagnetic layer 206 comprises a Co layer 206a and an Fe-rich CoFeB layer 206b, as described above with reference to FIG. 2. In a further embodiment, a capping layer 118, for example, an MgO layer having a surface orientation of (100), or alternatively, an $AlO_x$ layer, is formed on the second free ferromagnetic layer 206, as described above with reference to FIG. 2.

Figure 5:
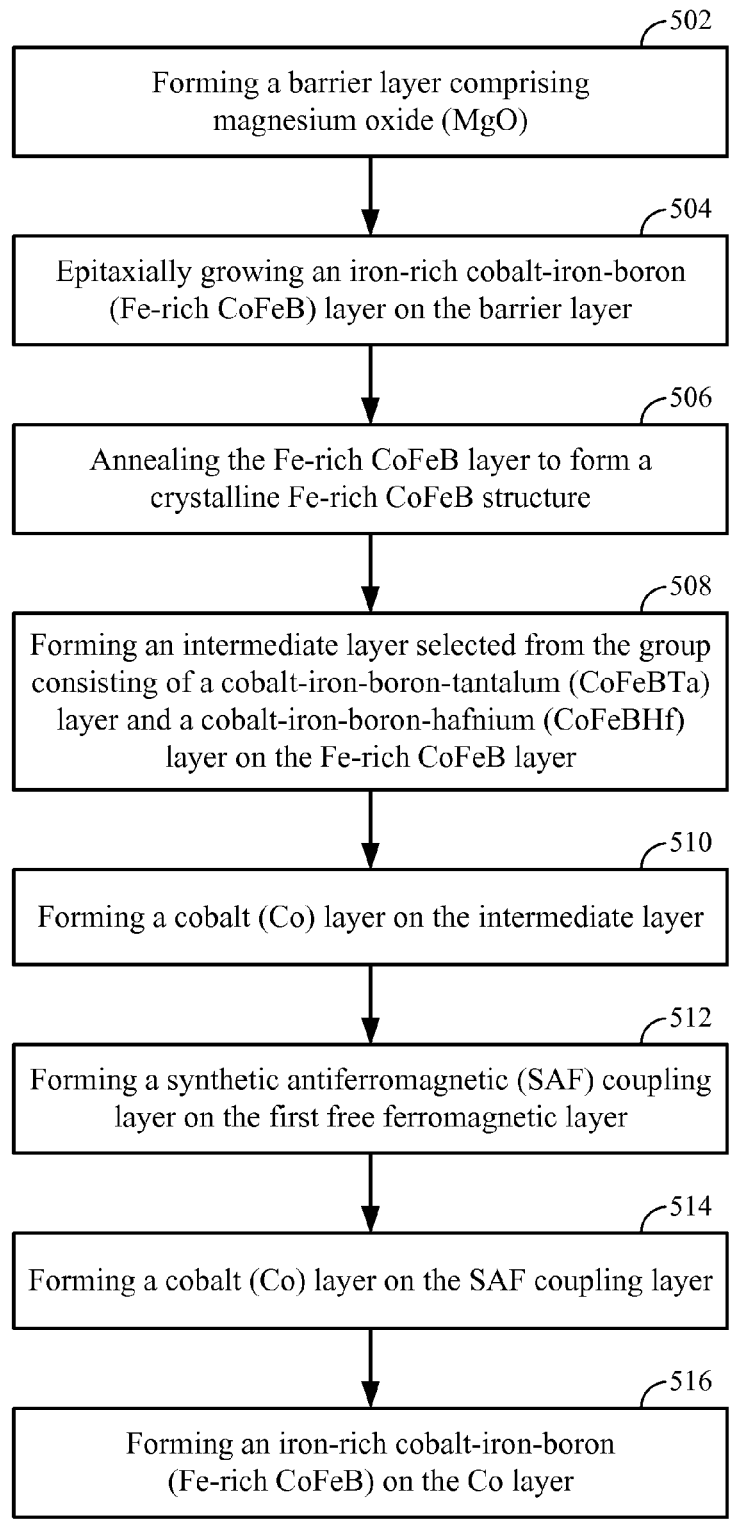
FIG. 5 is a more detailed flowchart illustrating a method of making an MTJ device according to embodiments of the present invention.

FIG. 5 is a more detailed flowchart illustrating a method of making an MTJ device according to embodiments of the present invention. In FIG. 5, a barrier layer comprising MgO is formed in step 502. An Fe-rich CoFeB layer is then epitaxially grown on the barrier layer in step 504, and the Fe-rich CoFeB layer is annealed to form a crystalline Fe-rich CoFeB structure in step 506. In an embodiment, the Fe-rich CoFeB layer is subjected to a high-temperature annealing process to transform the Fe-rich CoFeB material from an amorphous structure to a crystalline structure.

In an embodiment, an intermediate layer comprising a material selected from the group consisting of CoFeBTa and CoFeBHf is formed on the Fe-rich CoFeB layer in step 508. A Co layer is then formed on the intermediate layer in step 510. In an embodiment, a thin layer of cobalt with a thickness of not more than 5 Angstroms is formed on the intermediate layer, which may be either CoFeBTa or CoFeBHf. The Fe-rich CoFeB layer, the intermediate layer and the Co layer made according to steps 504, 506, 508 and 510 together form a first free ferromagnetic layer, such as the first free ferromagnetic layer 202 described above with reference to FIG. 2.

Referring to FIG. 5, a synthetic antiferromagnetic (SAF) coupling layer is formed on the first free ferromagnetic layer in step 512. As described above, the SAF coupling layer may comprise ruthenium, or alternatively, chromium. A Co layer is then formed on the SAF coupling layer in step 514. In an embodiment, the Co layer formed on top of the SAF coupling layer may be a thin layer of cobalt with a thickness of not more than 5 Angstroms. Subsequently, an Fe-rich CoFeB layer is formed on the Co layer in step 516. The Co layer and the Fe-rich CoFeB layer made according to steps 514 and 516 together form a second free ferromagnetic layer, such as the second free ferromagnetic layer 206 described above with reference to FIG. 2. In a further embodiment, a capping layer 118, such as an MgO layer with a surface orientation of (100), or alternatively, an $AlO_x$ layer, may be formed on top of the Fe-rich CoFeB layer made according to step 516.

While the foregoing disclosure describes illustrative embodiments of the invention, it should be noted that various changes and modifications could be made herein without departing from the scope of the invention as defined by the appended claims. The functions, steps or actions in the method and apparatus claims in accordance with the embodiments of the invention described herein need not be performed in any particular order unless explicitly stated otherwise. Furthermore, although elements of the invention may be described or claimed in the singular, the plural is contemplated unless limitation to the singular is explicitly stated.

What is claimed is:

1. A magnetoresistive random access memory (MRAM) device, comprising:
   a first free ferromagnetic layer having a first magnetic moment;
   a synthetic antiferromagnetic (SAF) coupling layer disposed on the first free ferromagnetic layer, the first free ferromagnetic layer and the SAF coupling layer forming a first planar interfacing surface; and
   a second free ferromagnetic layer disposed on the SAF coupling layer, the second free ferromagnetic layer and the SAF coupling layer forming a second planar interfacing surface, the second free ferromagnetic layer having a second magnetic moment opposite to the first magnetic moment of the first free ferromagnetic layer, where the first and second magnetic moments are perpendicular to the first and second planar interfacing surfaces.

2. The MRAM device of claim 1, wherein the first free ferromagnetic layer comprises an iron-rich cobalt-iron-boron (Fe-rich CoFeB) layer.

3. The MRAM device of claim 2, wherein the first free ferromagnetic layer further comprises a cobalt-iron-boron-tantalum (CoFeBTa) layer on the Fe-rich CoFeB layer.

4. The MRAM device of claim 3, wherein the first free ferromagnetic layer further comprises a cobalt (Co) layer on the CoFeBTa layer.

5. The MRAM device of claim 2, wherein the first free ferromagnetic layer further comprises a cobalt-iron-boron-hafnium (CoFeBHf) layer on the Fe-rich CoFeB layer.

6. The MRAM device of claim 5, wherein the first free ferromagnetic layer further comprises a cobalt (Co) layer on the CoFeBHf layer.

7. The MRAM device of claim 1, wherein the second free ferromagnetic layer comprises a cobalt (Co) layer on the SAF coupling layer.

8. The MRAM device of claim 7, wherein the second free ferromagnetic layer further comprises an iron-rich cobalt-iron-boron (Fe-rich CoFeB) layer on the Co layer.

9. The MRAM device of claim 1, wherein the SAF coupling layer comprises ruthenium (Ru).

10. The MRAM device of claim 1, wherein the SAF coupling layer comprises chromium (Cr).

11. The MRAM device of claim 1, further comprising a capping layer on the second free ferromagnetic layer having a high perpendicular magnetic anisotropy (PMA).

12. The MRAM device of claim 11, wherein the capping layer comprises magnesium oxide (MgO).

13. The MRAM device of claim 12, wherein the MgO has a surface orientation of (100).

14. The MRAM device of claim 11, wherein the capping layer comprises aluminum oxide ($AlO_x$).

15. The MRAM device of claim 1, further comprising a barrier layer connected to the first free ferromagnetic layer.

16. The MRAM device of claim 15, wherein the barrier layer comprises a magnesium oxide (MgO) layer.

17. The MRAM device of claim 16, wherein the MgO layer has a surface orientation of (100).

18. A magnetic tunnel junction (MTJ) device, comprising:
    a first free ferromagnetic layer having a first magnetic moment;
    a synthetic antiferromagnetic (SAF) coupling layer disposed on the first free ferromagnetic layer, the first free ferromagnetic layer and the SAF coupling layer forming a first planar interfacing surface; and
    a second free ferromagnetic layer disposed on the SAF coupling layer, the second free ferromagnetic layer and the SAF coupling layer forming a second planar interfacing surface, the second free ferromagnetic layer having a second magnetic moment opposite to the first magnetic moment of the first free ferromagnetic layer, where the first and second magnetic moments are perpendicular to the first and second planar interfacing surfaces.

19. The MTJ device of claim 18, wherein the first free ferromagnetic layer comprises:
    an iron-rich cobalt-iron-boron (Fe-rich CoFeB) layer;
    a cobalt-iron-boron-tantalum (CoFeBTa) layer on the Fe-rich CoFeB layer; and
    a cobalt (Co) layer on the CoFeBTa layer.

20. The MTJ device of claim 18, wherein the first free ferromagnetic layer comprises:
    an iron-rich cobalt-iron-boron (Fe-rich CoFeB) layer;
    a cobalt-iron-boron-hafnium (CoFeBHf) layer on the Fe-rich CoFeB layer; and
    a cobalt (Co) layer on the CoFeBHf layer.

21. The MTJ device of claim 18, wherein the second free ferromagnetic layer comprises:
    a cobalt (Co) layer on the SAF coupling layer; and
    an iron-rich cobalt-iron-boron (Fe-rich CoFeB) layer on the Co layer.

22. The MTJ device of claim 18, wherein the SAF coupling layer comprises ruthenium (Ru).

23. The MTJ device of claim 18, wherein the SAF coupling layer comprises chromium (Cr).

24. The MTJ device of claim 18, further comprising:
    a capping layer on the second free ferromagnetic layer having a high perpendicular magnetic anisotropy (PMA); and
    a barrier layer connected to the first free ferromagnetic layer.

* * * * *